(12) United States Patent
Yamauchi et al.

(10) Patent No.: US 7,348,630 B2
(45) Date of Patent: Mar. 25, 2008

(54) SEMICONDUCTOR DEVICE FOR HIGH FREQUENCY USES AND MANUFACTURING METHOD OF THE SAME

(75) Inventors: Tsunenori Yamauchi, Kawasaki (JP); Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/901,196

(22) Filed: Jul. 29, 2004

(65) Prior Publication Data

US 2005/0179085 A1      Aug. 18, 2005

(30) Foreign Application Priority Data

Feb. 13, 2004      (JP)      ............................. 2004-036040

(51) Int. Cl.
 *H01L 29/94*      (2006.01)
(52) U.S. Cl. ..................... 257/336; 257/337; 257/339; 257/E29.319
(58) Field of Classification Search ................ 257/335, 257/344, 336, 337, 339, E29.319
See application file for complete search history.

(56) References Cited

U.S. PATENT DOCUMENTS

| | | | |
|---|---|---|---|
| 4,561,168 A * | 12/1985 | Pitzer et al. ................ 438/274 |
| 4,672,407 A * | 6/1987 | Nakagawa et al. ......... 257/142 |
| 4,782,372 A * | 11/1988 | Nakagawa et al. ......... 257/141 |
| 6,413,822 B2 * | 7/2002 | Williams et al. ........... 438/270 |
| 6,781,195 B2 * | 8/2004 | Wu et al. ................... 257/329 |

FOREIGN PATENT DOCUMENTS

JP      2002-094054 A      3/2002

OTHER PUBLICATIONS

Neamen, Semiconductor Physics and Devices, 1992, The McGraw-Hill Companies, Inc., p. 420.*
Yukio Fukuda, A new Aluminum Pattern Formation Using Substitution Reaction of Aluminum for Polysilicon and Its Application to Mos Device Fabrication, IEEE Transaction on electron devices, vol. ED-31, No. 6, Jun. 1984, p. 828-832.*

(Continued)

*Primary Examiner*—Lynne Gurley
*Assistant Examiner*—Samuel A Gebremariam
(74) *Attorney, Agent, or Firm*—Westerman, Hattori, Daniels & Adrian, LLP.

(57) ABSTRACT

The semiconductor device has a semiconductor substrate, gate electrodes formed above the semiconductor substrate, and a pair of impurity diffusion layers formed in a surface layer of the semiconductor substrate at both sides of each of the gate electrodes. The semiconductor device also has drift layers formed in the surface layer of the semiconductor substrate between the gate electrodes and one of the impurity diffusion layers as a same conduction type as the impurity diffusion layers. The gate electrodes are made of metal including aluminum, and each is formed in an overhang shape. The semiconductor device can provide an LDMOS transistor enhanced in maximum transmission frequency and power gain and capable of a high-frequency operation with high efficiency as a basic element of a high-frequency power amplifier.

5 Claims, 6 Drawing Sheets

OTHER PUBLICATIONS

Hiroshi Horie et al., "Polysilicon-Aluminum Substitute (PAS) Technique for Subquartermicron Logic/DRAM LSIs", The Institute of Electronics, Information and Communication Engineers, Technical Report of IEICE, SDM 96-208, pp. 15-21, 1997.

M. Shindo et al., "High Power LDMOS for Cellular Base Station Applications", ISPSD, pp. 107-110, 2001.

Hiroshi Horie et al., "Novel High Aspect Ratio Aluminum Plug for Logic/DRAM LSIs Using Polysilicon-Aluminum Substitute (PAS)", IEDM 96, pp. 946-948, 1996.

"Priority Task on Power Device for 21$^{st}$ Century", Technical Report of the Institute of Electrical Engineers of Japan No. 666, pp. 36-44, 1998.

* cited by examiner

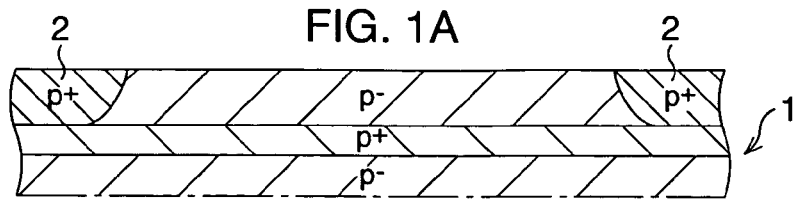
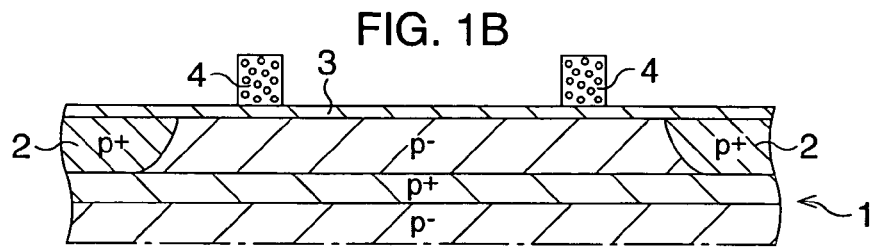
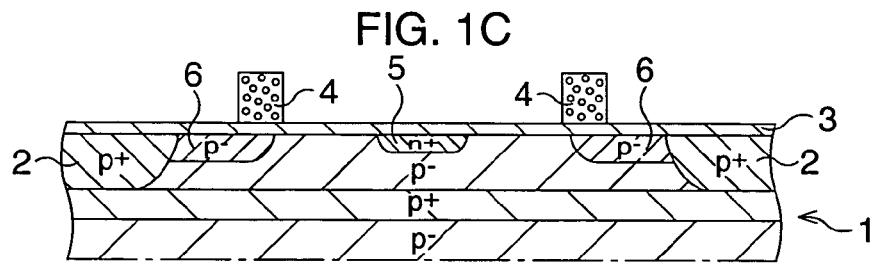
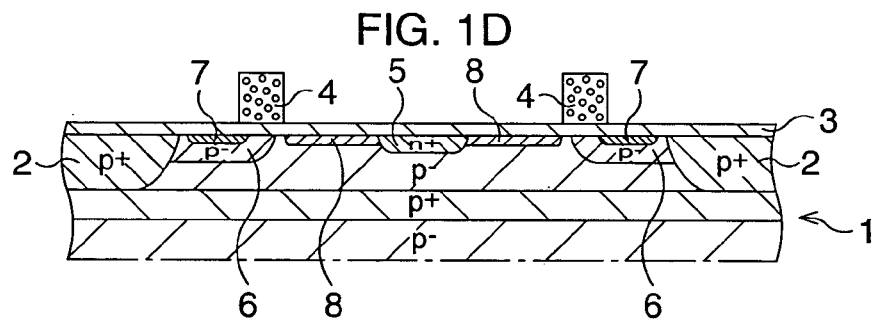
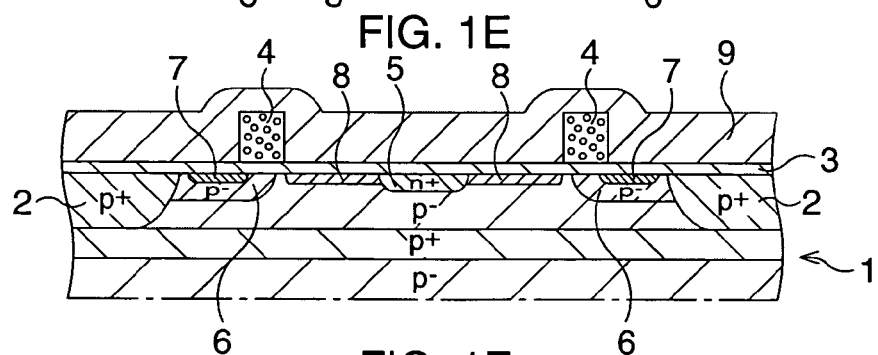
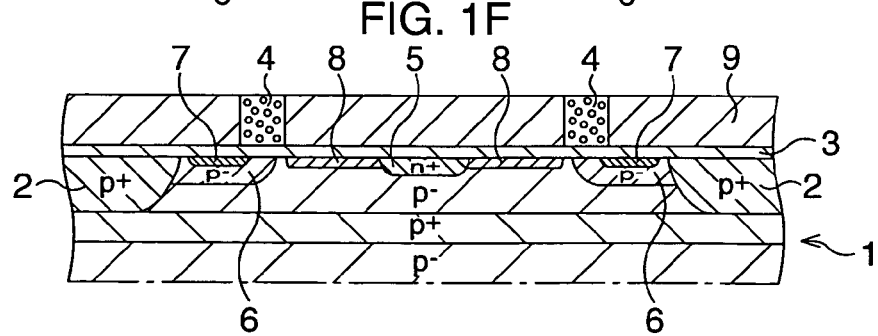

SEMICONDUCTOR DEVICE FOR HIGH FREQUENCY USES AND MANUFACTURING METHOD OF THE SAME

CROSS-REFERENCE TO RELATED APPLICATIONS

This application is based upon and claims the benefit of priority from the prior Japanese Patent Application No. 2004-036040, filed on Feb. 13, 2004, the entire contents of which are incorporated herein by reference.

BACKGROUND OF THE INVENTION

1. Field of the Invention

The present invention relates to a semiconductor device used as a high-frequency device and a manufacturing method of the same.

2. Description of the Related Art

An output transistor for use at high frequency, which is intended for a portable cellular phone, a base station of a wireless LAN and the like has been developed conventionally. For example, GaAsFETs are frequently used as a high-frequency output transistor of a microwave band from 500 MHz to 5 GHz, but with the recent advancement of the silicon LSI technique, they are being replaced with so-called silicon LDMOS (Laterally Diffused MOS) transistors which are at lower cost with higher quality than the GaAsFETs.

A schematic constitution of a conventional LDMOS transistor is shown in FIG. 6.

As shown in FIG. 6, electrode-shaped polysilicon films 111 and W silicide films 112 on the polysilicon films 111 are formed by patterning above a p$^-$/p$^+$/p$^-$ type silicon semiconductor substrate 101 via a gate insulating film 102, and an interlayer insulating film 103 is formed to cover them. Source diffusion layers 104 and an n$^+$ drain contact layer 105 formed by introducing an n-type impurity are formed in a surface layer of the semiconductor substrate 101, and n$^-$ drift layers 106 connected to the n$^+$ drain contact layer 105 to secure high frequency tolerance are formed between the n$^+$ source diffusion layers 104 and the n$^+$ drain contact layer 105. Further, p$^-$ channel diffusion layers 107 and substrate contact diffusion layers 108 connected to the p$^-$ channel diffusion layers 107 are further formed in this surface layer to cover the n$^+$ source diffusion layers 104.

Openings 109 and 110 are formed in the interlayer insulating film 103. The opening 109 is formed so that a part of a surface of the n$^+$ drain contact layer 105 is exposed, and the opening 110 is formed so that a part of a surface of the source diffusion layer 104 and a part of a surface of a substrate contact diffusion layer 108 are exposed. A drain electrode 121 formed by electrically connecting the opening 109 to the embedded n$^+$ drain contact layer 105 via an underlying film 113 on the interlayer insulating film 103, source electrodes 122 each formed by electrically connecting the opening 110 to the embedded source diffusion layer 104 via the underlying film 113 on the interlayer insulating film 103, and upper electrodes 123 each formed by being electrically connected to the W silicide film 112 and the polysilicon film 111 via the underlying film 113 on the interlayer insulating film 103 are provided, and thereby the LDMOS transistor is constituted. Here, aluminum or an aluminum alloy is used as a material of the drain electrode 121, the source electrodes 122 and the upper electrodes 123, and gate electrodes 124 are each constituted of the polysilicon film 111, the W silicide film 112 and the upper electrode 123.

[Patent Document 1] Japanese Patent Application Laid-open No. 2002-94054

[Non Patent Document 1] Hiroshi Horie, Masahiko, Imai, Akio Ito, and Yoshihiro Arimoto: "Novel High Aspect Ratio Aluminum Plug for Logic/DRAm LSIs Using Polysilicon-Aluminum Substitute (PAS)", IEDM96, p. 946, (1996)

[Non Patent Document 2] Hiroshi Horie, Masahiko Imai, Akio Ito, and Yoshihiro Arimoto: "Microscopic Wiring Technique by Polysilicon-Aluminum Substitute", The Institute of Electronics, Information and Communication Engineers, Technical Report of IEICE, SDM96-208 (1997)

[Non Patent Document 3] "Priority Task on Power Device for 21$^{th}$ Century", Technical Report of the Institute of Electrical Engineers of Japan No. 666, p.36 (1998)

[Non Patent Document 4] M. Shindo, M. Morikawa, T. Fujioka, K. Nagura, K. Kurotani, K. Odaira, T. uchiyama, and I. Yoshida: "High Power LDMOS for Cellular Base Station Applications", ISPSD 2001, p. 107 (2001)

The performance indicators of the output transistor used for high frequency are maximum transmission frequency $f_{max}$ predicting the high-frequency operation limit and power gain. In order to increase the $f_{max}$, it is necessary to reduce gate parasite resistance, and in order to increase the power gain, it is necessary to reduce parasite capacity $C_{gd}$ between the gate electrode and the drain electrode.

In the high-frequency power amplifier, it is necessary to increase power of radio waves to be outputted with respect to power applied to the amplifier in order to generate more effective radio waves. This is an extremely important task especially for portable cellular phones using batteries as their power sources. In order to enable a high-frequency operation with high efficiency, it is necessary to completely reduce the parasite resistance and the parasite capacity. A cutoff frequency $f_T$ being a performance indicator strongly depends on the parasite capacity as shown by equation (1). The maximum transmission frequency $f_{max}$ depends on the gate parasite resistance as shown by equation (2).

$$f_T = gm / \{2\pi(C_{gs}+C_{ds})\} \tag{1}$$

(gm: mutual conductance, $C_{gs}$: gate-source parasite capacity, $C_{ds}$: drain-source parasite capacity)

$$f_{max} = f_T / \{2(Rg \cdot Gd)^{1/2}\} \tag{2}$$

(Rg: gate parasite resistance, Gd: drain conductance)

The parasite capacities $C_{gs}$ and $C_{ds}$ inhibit the cutoff frequency $f_T$, and the gate parasite resistance Rg inhibits the maximum transmission frequency $f_{max}$.

Since the gate structure in which the polysilicon film 111 and the W silicide film 112 are laid on each other is adopted in the prior art, as shown in FIG. 6, the gate parasite resistance Rg is about 10 Ω/square, and reduction in this gate parasite resistance Rg is limited. The gate parasite resistance Rg becomes more noticeable as the gate length is made shorter, and reduction of this is the task for a high-frequency operation. Further, the fact that a depletion layer extends to the polysilicon side of the gate electrode and the mutual conductance gm is reduced also inhibits the high-frequency operation.

The output transistor for use at high frequency is demanded of reduction in the gate parasite resistance to its extreme limit for the purpose of achieving high performance, but even the LDMOS transistor developed to realize this has the problem as described above.

SUMMARY OF THE INVENTION

The present invention is made to solve the above-described problems, and has its object to provide an LDMOS transistor enhanced in $f_{max}$ and power gain and capable of a high-frequency operation with high efficiency as a basic element of a high-frequency power amplifier represented by a mobile cellular phone and a wireless LAN, and its manufacturing method.

A semiconductor device of the present invention includes a semiconductor substrate, gate electrodes formed above the aforesaid semiconductor substrate, a pair of impurity diffusion layers formed in a surface layer of the aforesaid semiconductor substrate at both sides of each of the aforesaid gate electrodes, and drift layers formed in the surface layer of the aforesaid semiconductor substrate between the aforesaid gate electrodes and one of the aforesaid impurity diffusion layers as a same conduction type as the aforesaid impurity diffusion layers, and the aforesaid gate electrodes are each formed in an overhang shape with metal including aluminum as a material.

A manufacturing method of a semiconductor device of the present invention includes the steps of forming polysilicon films each in an electrode shape via a gate insulating film on a semiconductor substrate, introducing an impurity into a surface layer of the aforesaid semiconductor substrate and forming a pair of impurity diffusion layers and drift layers, respectively;

forming an interlayer insulating film above the aforesaid semiconductor substrate to cover the polysilicon films;

exposing top surfaces of the polysilicon films by removing a surface layer of the interlayer insulating film, forming openings in the interlayer insulating film to expose a part of a surface of each of the impurity diffusion layers;

forming a metallic film including aluminum on the interlayer insulating film to fill each of the openings;

selectively performing substitution reaction of polysilicon and aluminum and charging regions of formation of the polysilicon films in the interlayer insulating film with the material of the metallic film, and forming a pair of electrodes connected to the respective impurity diffusion layers and gate electrodes integrally formed of the material of the metallic film by working the metallic film.

BRIEF DESCRIPTION OF THE DRAWINGS

FIGS. 1A, 1B, 1C, 1D, 1E and 1F are schematic sectional views showing a manufacturing method of an LDMOS transistor according to a first embodiment in sequence of process steps;

DETAILED DESCRIPTION OF THE PREFERRED EMBODIMENTS

Basic Gist of the Present Invention

Figure 2A:
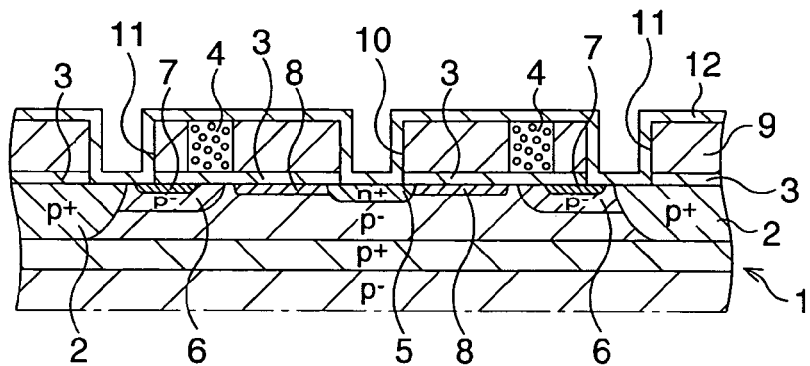
FIGS. 2A, 2B, 2C and 2D are schematic sectional views showing the manufacturing method of the LDMOS transistor according to the first embodiment in the sequence of the process steps, which are continued from FIG. 1A, 1B, 1C, 1D, 1E and 1F.

The inventors studied improvement of the gate electrode material of the LDMOS transistor in order to realize enhancement in both fmax and power gain in the LDMOS transistor. In the gate electrode of the conventional LDMOS transistor, the lower layer of the gate electrode is formed by patterning by using polysilicon, in its constitution, and therefore reduction in the parasite resistance and parasite capacity is limited. The inventors have conceived to constitute the gate electrodes of aluminum (Al) (or an aluminum alloy: hereinafter described as Al in the same meaning). By using Al for the gate materials, the gate parasite resistance becomes about 1/50 and large improvement is made possible. At the same time, spread of the depletion layer into the gate electrode region does not exist at all, thus enhancing the channel mobility by about 1.2 times.

In order to realize the above-described gate electrode, the substitution reaction between the polysilicon and Al is utilized. Namely, the polysilicon film is formed by patterning first as in the related art, and after the Al film is formed on the interlayer insulating film to be in contact with the polysilicon film, the polysilicon film in the interlayer insulating film is replaced with Al by performing heat treatment. By patterning this, the gate electrode constituted of Al, which is low in the gate parasite resistance and high in mobility, is formed.

According to the same process as formation of the gate electrode, the shield layer constituted of Al is formed between the gate electrode and the electrode at one side (drain electrode). This shield layer is for further enhancing the high-frequency performance, and can be formed by providing in the mask another pattern of the shield electrode between the gate electrode and the drain electrode in addition to the pattern of the gate electrode without adding any process steps at all, which makes it possible to specify the space between the gate electrode and the shield layer with very high precision and simplify the manufacturing process of sputtering, photo etching, growing the insulating film and the like for forming the shield layer.

Concrete Embodiments of the Present Invention

Preferred embodiments to which the present invention is applied will be explained hereinafter. In the embodiments, the constitution of the LDMOS transistor will be described as well as its manufacturing method.

First Embodiment

FIGS. 1A, 1B, 1C, 1D, 1E and 1F, and FIGS. 2A, 2B, 2C and 2D are schematic sectional views showing a manufacturing method of an LDMOS transistor according to a first embodiment in the sequence of the process steps.

First, as shown in FIG. 1A, a predetermined photo mask (not shown) is formed on a p−/p+/p− type silicon semiconductor substrate 1, then ion implantation of a p-type impurity, boron (B) in this case, is performed for a surface layer of the semiconductor substrate 1 with use of the photo mask as a mask under the conditions of an acceleration energy of 60 keV, and a dosage of $2 \times 10^{15}/cm^2$, and after the aforesaid photo mask is removed by incineration processing or the like, the heat treatment at 1100° C. is applied to the semiconductor substrate 1 for 30 minutes, whereby a substrate contact layer 2 is formed.

Subsequently, as shown in FIG. 1B, a gate insulating film 3 of a thickness of about 10 nm is formed on a surface of the semiconductor substrate 1 by the thermal oxidation method. Subsequently, polysilicon films 4 are deposited by the CVD method, and the polysilicon films 4 are each worked into an electrode shape by phtolithgraphy and the subsequent dry etching.

Subsequently, as shown in FIG. 1C, a predetermined photo mask (not shown) is formed above the silicon semiconductor substrate 1, and ion implantation of the p-type impurity, boron (B) in this case, is performed for the surface layer of the semiconductor substrate 1 at only one sides of the polysilicon films 4 under the conditions of the acceleration energy of 30 keV and the dosage of $2 \times 10^{13}/cm^2$, and after the aforesaid photo mask is removed by the incineration processing or the like, heat treatment at 1000° C. is applied to the semiconductor substrate 1 for 30 minutes, whereby a p-channel diffusion layers 6 are formed.

Subsequently, a predetermined photo mask (not shown) is formed above the silicon semiconductor substrate 1, and ion implantation of an n-type impurity, phosphorus (P) in this case, is performed for the surface layer of the semiconductor substrate 1 under the conditions of the acceleration energy of 120 keV and the dosage of $2 \times 10^{15}/cm^2$, and after the aforesaid photo mask is removed by the incineration processing or the like, heat treatment at 1000° C. is applied to the semiconductor substrate 1 for 30 minutes, whereby an n$^+$ drain contact layer 5 is formed.

Subsequently, as shown in FIG. 1D, a predetermined photo mask (not shown) is formed above the silicon semiconductor substrate 1, and ion implantation of the n-type impurity, phosphorus (P) in this case, is performed for the surface layer of the semiconductor substrate 1 under the conditions of the acceleration energy of 60 keV and the dosage of $3 \times 10^{12}/cm^2$, and after the aforesaid photo mask is removed by the incineration processing or the like, heat treatment at 950° C. is applied to the semiconductor substrate 1 for 30 minutes, whereby an n-drift layers 8 are formed.

Subsequently, a predetermined photo mask (not shown) is formed above the silicon semiconductor substrate 1, and ion implantation of an n-type impurity, arsenic (As) in this case, is performed for the surface layer of the semiconductor substrate 1 under the conditions of the acceleration energy of 30 keV and the dosage of $3 \times 10^{15}/cm^2$, and after the aforesaid photo mask is removed by the incineration processing or the like, heat treatment at 900° C. is applied to the semiconductor substrate 1 for 30 minutes, whereby n+ source diffusion layers 7 are formed.

Subsequently, as shown in FIG. 1E, a silicon oxide film is deposited to be 600 nm thick by the CVD method to cover the polysilicon films 4 above the semiconductor substrate 1 to form an interlayer insulating film 9. In this situation, portions of the interlayer insulating film 9, which correspond to upper portions of the polysilicon films 4, are raised higher by about 200 nm than the other portions.

Subsequently, as shown in FIG. 1F, a surface of the interlayer insulating film 9 is polished by the chemical mechanical polishing (CMP) method until top surfaces of the polysilicon films 4 are exposed. When the insulating film at the portions where the polysilicon films and aluminum are to be reacted is removed, photo etching is generally used. In that case, the insulating film at the other portions than the upper portions of the polysilicon films is etched due to a deviation of positioning of photolithography, and a favorable device structure cannot be obtained. In this embodiment, by using the CMP method as described above, the top surfaces of the polysilicon films 4 can be exposed in the manner of self align without requiring photo etching. Instead of the CMP method, a method of uniformly etching the regions of the interlayer insulating film 9 corresponding to the upper portions of the polysilicon films 4 may be used.

Subsequently, as shown in FIG. 2A, photolithography and the subsequent dry etching are performed for the interlayer insulating film 9, and a drain contact hole 10 in which a part of a surface of the n$^+$ drain contact layer 5 is exposed, and source contact holes 11 in which a part of the n$^+$ source diffusion layers 7 and a part of surfaces of the substrate contact layer 2 are exposed are formed respectively.

Subsequently, a TiN film is grown on the interlayer insulating film 9 to cover an internal wall surface of the drain contact hole 10 and internal wall surfaces of the source contact holes 11, and thereby an underlying film (barrier metal film) 12 is formed.

Figure 2B:
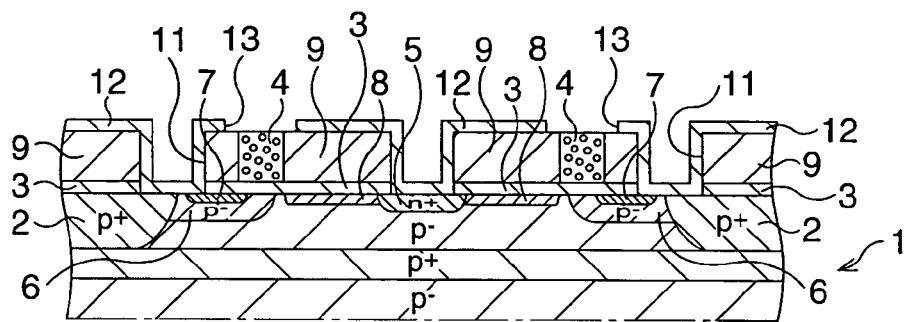

Here, the barrier metal film has been widely used as the barrier metal for preventing reaction of the aluminum and silicon at the portion of a contact hole. However, in this embodiment, the barrier metal film becomes an obstacle at the portion where aluminum substitutes for the polysilicon as will be described later. Therefore, as shown in FIG. 2B, photolithography and the subsequent dry etching are performed for the barrier metal film 12, and the regions of the barrier metal film 12, corresponding to the top surfaces of the polysilicon films 4 are removed, whereby openings 13 in which only the top surfaces of the polysilicon films 4 are exposed are formed.

Figure 2C:
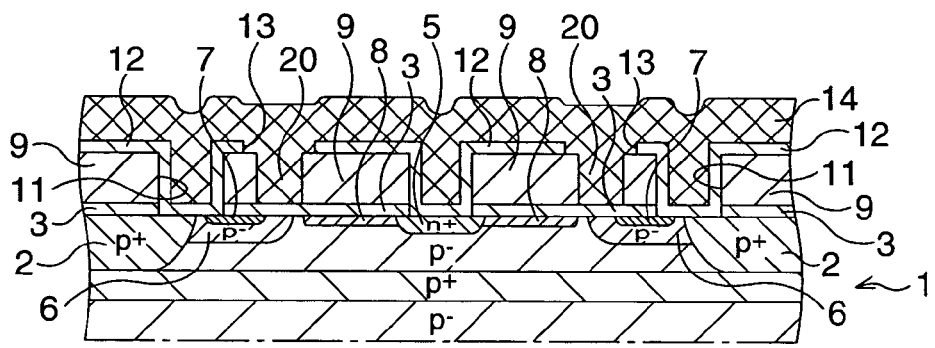

Subsequently, as shown in FIG. 2C, an Al film 14 is formed on an entire surface to be about 1000 nm thick by the sputtering method. In this case, the polysilicon films 4 and the Al film 14 are in direct contact with each other only in the openings 13. Then, by heat treatment at 450° C. for 60 minutes, the substitution reaction of the polysilicon films 4 and the Al film 14 is performed. As a result, the polysilicon films 4 are drawn out, while Al enters the formation regions of the polysilicon films 4 of the interlayer insulating film 9, and the polysilicon film 4 is replaced with an Al film 20. By removing the barrier metal film 12 only at the regions corresponding to the polysilicon films 4, the substitution reaction of the polysilicon and aluminum is caused only at the gate portions without causing the substitution reaction at the other portions.

Figure 2D:
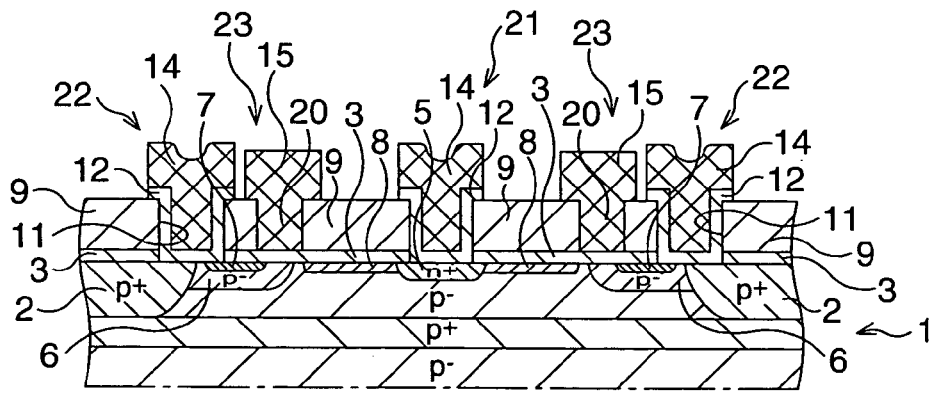

Subsequently, as shown in FIG. 2D, patterning of the Al films 14 and the barrier metal films 12 is performed by photolithography and the subsequent dry etching, and a drain electrode 21 in an overhang shape filling the drain contact hole 10 via the barrier metal film 12, source electrodes 22 each in the overhang shape filling the source contact hole 11 via the barrier metal 12, and gate electrodes 23 each in the overhang shape in which Al film 20 and the upper electrode 15 are connected and they are made of Al, are formed at the same time. Here, for the reason of layout of the transistor, the distance between the gate electrode 23 and the drain electrode 21 is larger than the gate electrode 23 and the source electrode 22, and therefore the upper electrode 15 of the gate electrode 23 is formed into an asymmetrical shape which extends longer to the side of the drain electrode 21 shown in the drawing. As described above, the Al film 14 used in the above-described substitution reaction is left as it is and used for each kind of electrode, and therefore manufacturing process becomes extremely easy, thus leading to reduction in the manufacturing cost.

Thereafter, the LDMOS transistor of this embodiment is completed after formation of the electrode protection film, the bonding part (both are not shown) and the like.

Figure 3:
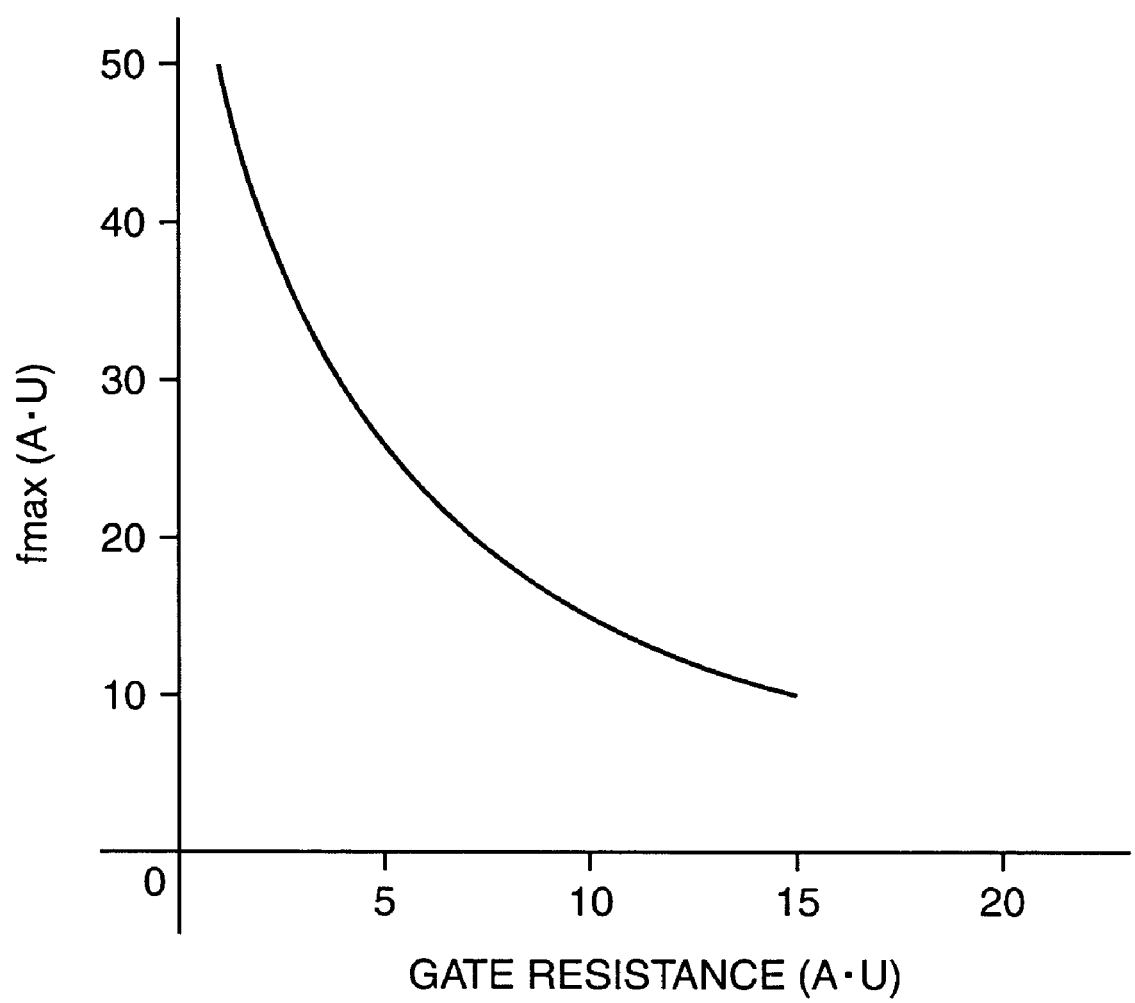
FIG. 3 is a characteristic diagram showing relationship between gate resistance and maximum transmission frequency.
Figure 6:
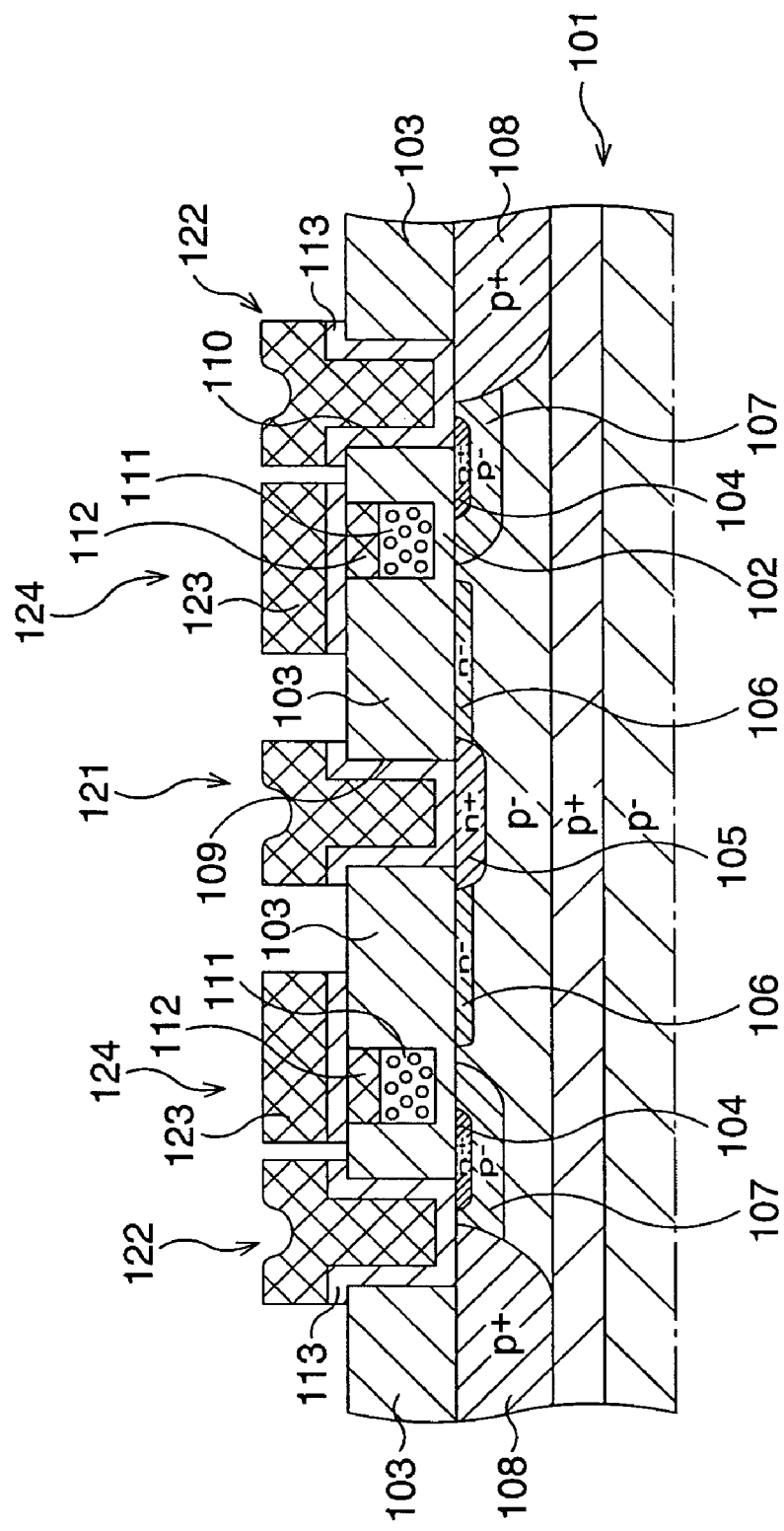
FIG. 6 is a schematic sectional view showing a constitution of a conventional LDMOS transistor.

In the LDOMS transistor of this embodiment, the gate parasite resistance drastically reduces to $\frac{1}{10}$ as compared with the conventional constitution shown in FIG. 6. The channel mobility increases by about 20%. By these effects, the maximum transmission frequency $f_{max}$ that is the indicator of the high-frequency operation increases from 20 GHz to 50 GHz, which is about 2.5 times as high as the prior art. FIG. 3 is a characteristic diagram showing the relationship between the gate resistance and the maximum transmission frequency. The reason why the values in FIG. 3 are lower than the values expected by the above-described expressions (1) and (2) is that they are limited by the elements other than the parameters included in these approximations.

In the prior art, the gate electrode is constituted of polycide, and therefore the gate parasite resistance is around 10 Ω/square in the sheet resistance, and the maximum transmission frequency especially remains at 20 GHz. By the aluminum substitution technique of this embodiment, the gate parasite resistance can be reduced to 0.2 Ω/square in the sheet resistance, which is $\frac{1}{50}$ of the prior art. As a result, the maximum transmission frequency is significantly increased to 50 GHZ. In the conventional structure, 2 GHz is the limit of the use frequency, but according to this embodiment, application to various wireless devices in a band of 5 GHz is made possible.

As explained above, according to this embodiment, the LDMOS transistor, which is enhanced in both of the $f_{max}$ and the power gain and capable of high-frequency operation with high efficiency as the basic element of the high-frequency power amplifier represented by a mobile cellular phone and a wireless LAN, is realized.

Second Embodiment

Here, a constitution of an LDMOS transistor and its manufacturing method are disclosed as in the first embodiment, and a second embodiment differs in the point that a shield layer is further formed without increasing the manufacturing process step.

FIGS. 4A, 4B, 4C, 4D, 4E and 4F and FIGS. 5A, 5B, 5C and 5D are schematic sectional views showing a manufacturing method of an LDMOS transistor according to the second embodiment in the sequence of the process steps.

Figure 4A:
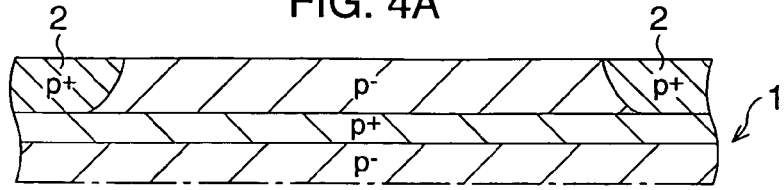
FIGS. 4A, 4B, 4C, 4D, 4E and 4F are schematic sectional views showing a manufacturing method of an LDMOS transistor according to a second embodiment in sequence of process steps.

First, as shown in FIG. 4A, a predetermined photo mask (not shown) is formed on a p⁻/p⁺/p⁻ type silicon semiconductor substrate 1, then ion implantation of a p-type impurity, boron (B) in this case, is performed for a surface layer of the semiconductor substrate 1 with use of the photo mask as a mask under the conditions of an acceleration energy of 60 keV and a dosage of $2\times10^{15}/cm^2$, and after the aforesaid photo mask is removed by incineration processing or the like, the heat treatment at 1100° C. is applied to the semiconductor substrate 1 for 30 minutes, whereby a substrate contact layer 2 is formed.

Figure 4B:
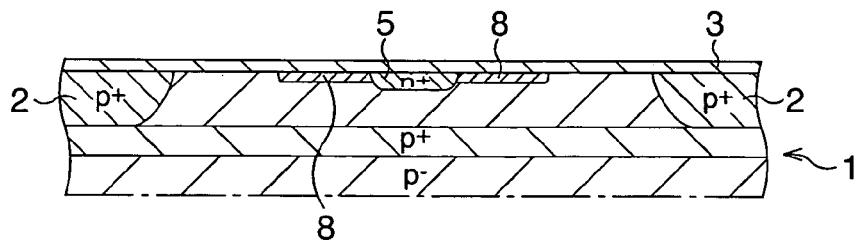

Subsequently, as shown in FIG. 4B, a gate insulating film 3 of a thickness of about 10 nm is formed on a surface of the semiconductor substrate 1 by the thermal oxidation method. Subsequently, a predetermined photo mask (not shown) is formed above the silicon semiconductor substrate 1, and ion implantation of an n-type impurity, phosphorus (P) in this case, is performed for the surface layer of the semiconductor substrate 1 under the conditions of the acceleration energy of 120 keV and the dosage of $2\times10^{15}/cm^2$, and after the aforesaid photo mask is removed by the incineration processing or the like, heat treatment at 1000° C. is applied to the semiconductor substrate 1 for 30 minutes, whereby an n⁺ drain contact layer 5 is formed.

Subsequently, a predetermined photo mask (not shown) is formed above the silicon semiconductor substrate 1, and ion implantation of the n-type impurity, phosphorus (P) in this case, is performed for the surface layer of the semiconductor substrate 1 under the conditions of the acceleration energy of 60 keV and the dosage of $3\times10^{12}/cm^2$, and after the aforesaid photo mask is removed by the incineration processing or the like, heat treatment at 950° C. is applied to the semiconductor substrate 1 for 30 minutes, whereby an n-drift layer 8 is formed.

Figure 4C:
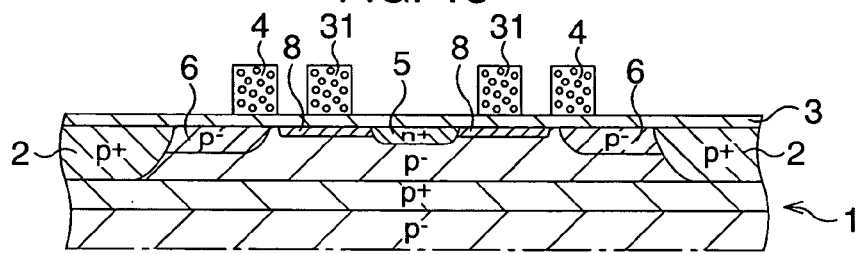

Subsequently, as shown in FIG. 4C, polysilicon films 4 are deposited by the CVD method, and the polysilicon films 4 and polysilicon films 31 adjacent to the polysilicon films 4 are simultaneously formed by photolithography and the subsequent dry etching.

Subsequently, a predetermined photo mask (not shown) is formed above the silicon semiconductor substrate 1, and ion implantation of the p-type impurity, boron (B) in this case, is performed for the surface layer of the semiconductor substrate 1 at only one sides of the polysilicon films 4 under the conditions of the acceleration energy of 30 keV and the dosage of $2\times10^{13}/cm^2$, and after the aforesaid photo mask is removed by the incineration processing or the like, heat treatment at 1000° C. is applied to the semiconductor substrate 1 for 30 minutes, whereby a p-channel diffusion layer 6 is formed.

Figure 4D:
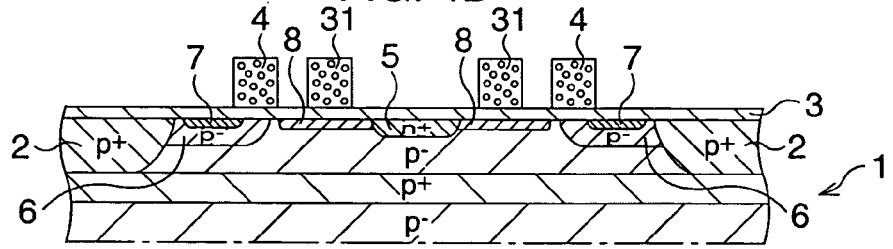

Subsequently, as shown in FIG. 4D, a predetermined photo mask (not shown) is formed above the silicon semiconductor substrate 1, and ion implantation of an n-type impurity, arsenic (As) in this case, is performed for the surface layer of the semiconductor substrate 1 under the conditions of the acceleration energy of 30 keV and the dosage of $3\times10^{15}/cm^2$, and after the aforesaid photo mask is removed by the incineration processing or the like, heat treatment at 900° C. is applied to the semiconductor substrate 1 for 30 minutes, whereby n⁺ source diffusion layers 7 are formed.

Figure 4E:
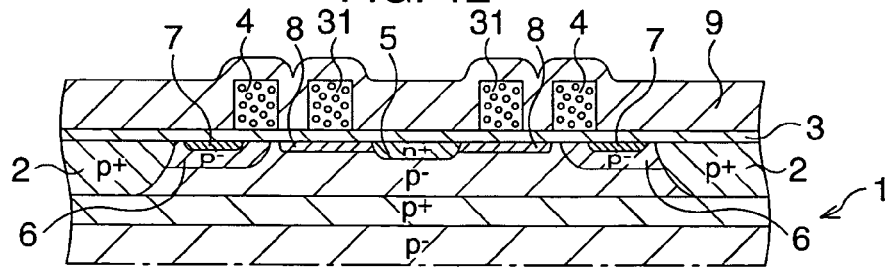

Subsequently, as shown in FIG. 4E, a silicon oxide film is deposited to be 600 nm thick by the CVD method above the semiconductor substrate 1 to cover the polysilicon films 4 and 31, whereby an interlayer insulating film 9 is formed. In this situation, portions of the interlayer insulating film 9, which correspond to upper portions of the polysilicon films 4 and 31 are raised higher by about 200 nm than the other portions.

Figure 4F:
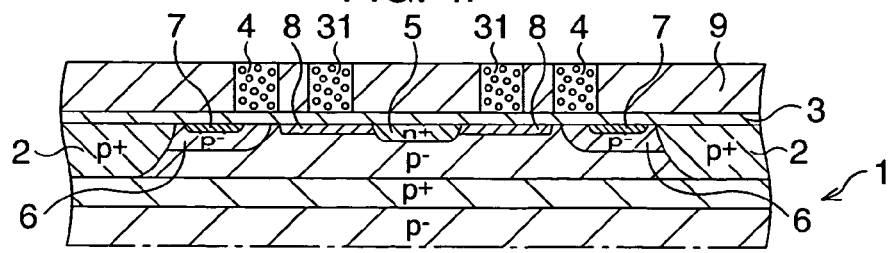

Subsequently, as shown in FIG. 4F, a surface of the interlayer insulating film 9 is polished by the chemical mechanical polishing (CMP) method until top surfaces of the polysilicon films 4 and 31 are exposed. When the insulating film at the portion where the polysilicon film and aluminum are to be reacted is removed, photo etching is generally used. In that case, the insulating film other than at the upper portion of the polysilicon film is etched due to a deviation of positioning in photolithography, and favorable device structure cannot be provided. In this embodiment, by using the CMP method as described above, the top surfaces of the polysilicon films 4 and 31 can be exposed in the manner of self align without requiring photo etching. Instead of the CMP method, a method of uniformly etching the regions corresponding to the upper portions of the polysilicon films 4 and 31 of the interlayer insulating film 9 may be used.

Figure 5A:
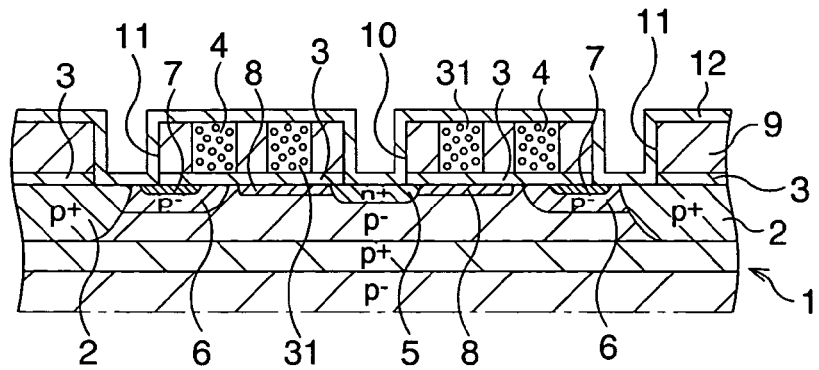
FIGS. 5A, 5B, 5C and 5D are schematic sectional views showing the manufacturing method of the LDMOS transistor according to the second embodiment in the sequence of the process steps, which are continued from FIG. 4A, 4B, 4C, 4D, 4E and 4F.

Subsequently, as shown in FIG. 5A, photolithography and the subsequent dry etching are performed for the interlayer insulating film 9, and a drain contact hole 10 in which a part of a surface of the n+ drain contact layer 5 is exposed, and source contact holes 11 in which a part of the n+ source diffusion layers 7 and a part of surfaces of the substrate contact layers 2 are exposed are formed respectively.

Subsequently, a TiN film is grown on the interlayer insulating film 9 to cover an internal wall surface of the drain contact hole 10 and internal wall surfaces of the source contact holes 11, and thereby an underlying film (barrier metal film) 12 is formed.

Figure 5B:
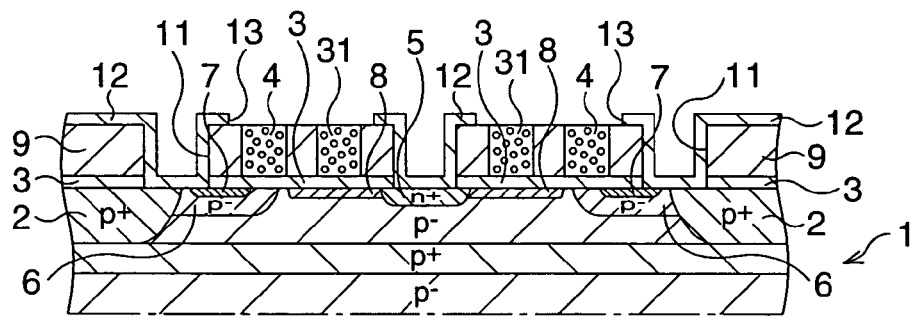
Figure 5C:
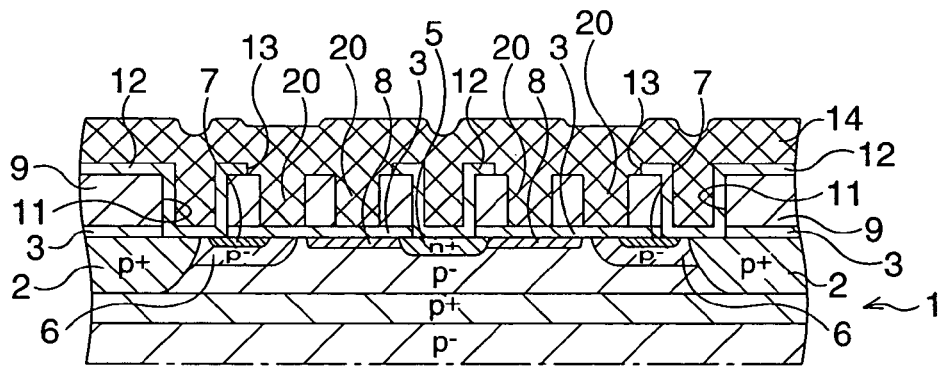

Here, the barrier metal film has been widely used as the barrier metal for preventing the reaction of aluminum and silicon at the portion of a contact hole. However, in this embodiment, the barrier metal film becomes an obstacle at the portion where aluminum substitutes for the polysilicon as will be described later. Therefore, as shown in FIG. 5B, photolithography and the subsequent dry etching are performed for the barrier metal film 12, and the regions of the barrier metal film 12, which correspond to the top surfaces of the polysilicon films 4 and 31 are removed, whereby openings 34 in which only the top surfaces are exposed are formed.

Figure 5D:
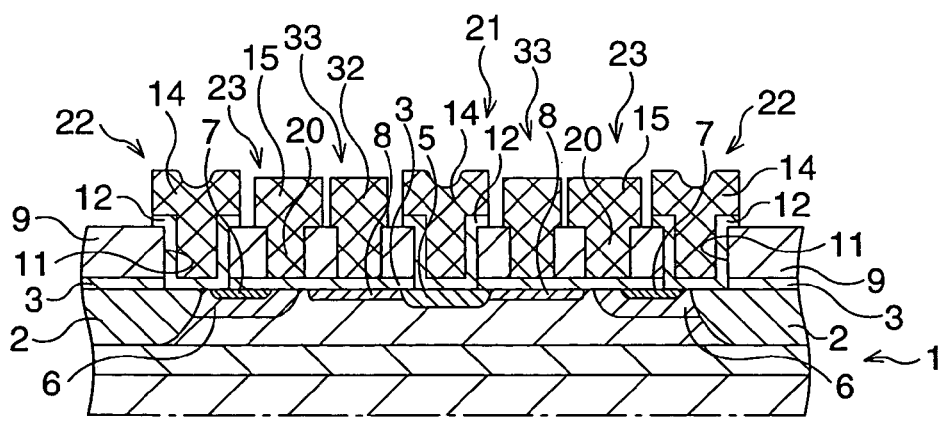

Subsequently, as shown in FIG. 5D, patterning of the Al film 14 and the barrier metal film 12 is performed by photolithography and the subsequent dry etching, and a drain electrode 21 in an overhang shape filling the drain contact hole 10 via the barrier metal film 12, source electrodes 22 each in the overhang shape filling the source contact hole 11 via the barrier metal 12, gate electrodes 23 each in the overhang shape in which Al film 20 and the upper electrode 15 are connected and they are made of Al, and shield layers 33 each in the overhang shape in which Al film 20 and an upper layer 32 are connected and they are made of Al, are formed at the same time. Here, for the reason of layout of the transistor, the distance between the gate electrode 23 and the drain electrode 21 is larger than the distance between the gate electrode 23 and the source electrode 22, and therefore the upper electrode 15 of the gate electrode 23 is formed into an asymmetrical shape which extends longer to the side of the drain electrode 21 as shown in the drawing. As described above, the Al film 14 used in the above-described substitution reaction is left as it is and used for each kind of electrode, and therefore manufacturing process becomes extremely easy, thus leading to reduction in the manufacturing cost.

Subsequently, as shown in FIG. 5D, patterning of the Al film 14 and the barrier metal film 12 is performed by photolithography and the subsequent dry etching, and a drain electrode 21 in an overhang shape filling the drain contact hole 10 via the barrier metal film 12, source electrodes 22 each in the overhang shape filling the source contact hole 11 via the barrier metal 12, gate electrodes 23 each in the overhang shape in which Al film 20 and the upper electrode 15 are connected and all of them are made of Al, and shield layers 33 each in the overhang shape in which Al film 20 and an upper layer 32 are connected and all of them are made of Al, are formed at the same time. Here, for the reason of layout of the transistor, the distance between the gate electrode 23 and the drain electrode 21 is larger than the distance between the gate electrode 23 and the source electrode 22, and therefore the upper electrode 15 of the gate electrode 23 is formed into an asymmetrical shape which extends longer to the side of the drain electrode 21 as shown in the drawing. As described above, the Al film 14 used in the above-described substitution reaction is left as it is and used for each kind of electrode, and therefore manufacturing process becomes extremely easy, thus leading to reduction in the manufacturing cost.

Thereafter, the LDMOS transistor of this embodiment is completed after the formation of the electrode protection film, the bonding part (both are not shown) and the like.

As described above, in this embodiment, the pattern of the shield electrodes is further provided between the gate electrode and the drain electrode in the photo mask in addition to the pattern of the gate electrodes, and thereby the shield layer 33 can be formed without adding any process steps at all.

As explained above, according to this embodiment, the LDMOS transistor, which is enhanced in both of the $f_{max}$ and the power gain and capable of high-frequency operation with high efficiency as the basic element of the high-frequency power amplifier represented by a mobile cellular phone and a wireless LAN, is realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a semiconductor substrate;
   gate electrodes formed above said semiconductor substrate;
   a pair of impurity diffusion layers formed in a surface layer of said semiconductor substrate at both sides of each of said gate electrodes;
   drift layers formed in the surface layer of said semiconductor substrate between said gate electrodes and one of said impurity diffusion layers as a same conduction type as said impurity diffusion layers; and
   a pair of electrodes each electrically connected to the pair of impurity diffusion layers via a barrier metal film,
   wherein said gate electrodes do not include said barrier metal film, and
   wherein said gate electrodes have an upper portion extending over a side of a lower portion and made of metal including aluminum and silicon as a material.

2. The semiconductor device according to claim 1, further comprising:
   a pair of electrodes formed above said semiconductor substrate to be connected to said respective impurity diffusion layers,
   wherein each of said electrodes is formed of the same material as said gate electrodes.

3. The semiconductor device according to claim 2,
   wherein said gate electrodes and said each electrode are formed so that lower parts of said electrodes are embedded in an interlayer insulating film formed above said semiconductor substrate, and wherein said each electrode is formed with a metallic underlying film interposed between said each electrode and said interlayer insulating film, and said gate electrodes are formed to be in direct contact with the interlayer insulating film.

4. The semiconductor device according to claim 2, wherein shield layers formed of the same material as said gate electrodes to partition both the gate electrodes and one of said electrodes are included between said gate electrodes and one of said electrodes.

5. The semiconductor device according to claim 1, wherein an upper part of each of said gate electrodes is formed in an asymmetrical shape extending longer to a side of the one of said impurity diffusion layers on the other side.

* * * * *